May 30, 1972 D. S. BEYNNON ET AL 3,666,463
MASK OVERLAY COMPARISON
Filed July 6, 1970
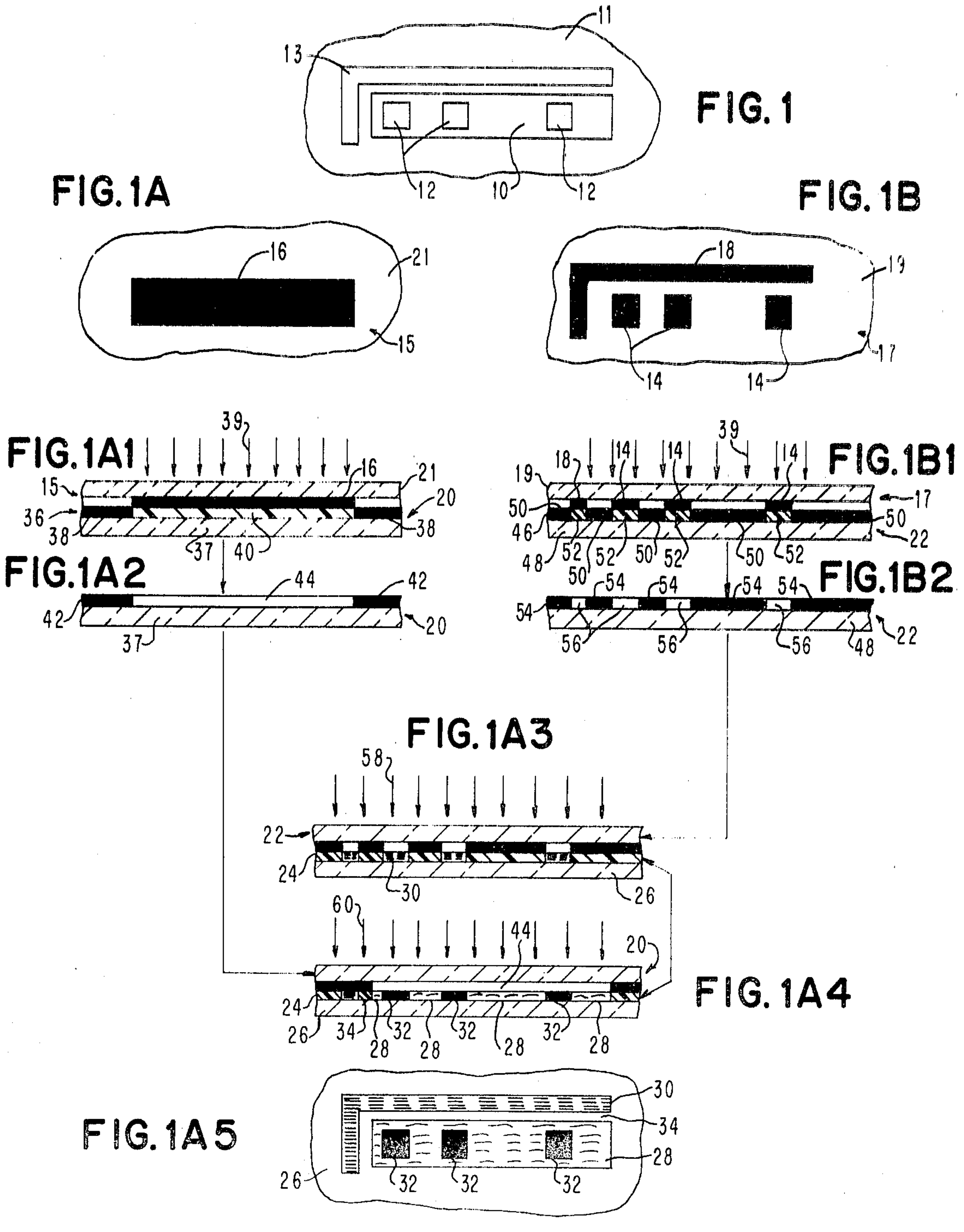
FIG. 1, FIG. 1A, FIG. 1B, FIG. 1A1, FIG. 1A2, FIG. 1B1, FIG. 1B2, FIG. 1A3, FIG. 1A4, FIG. 1A5
INVENTORS.
DAVID S. BEYNNON
BRUCE D. KING
BY Willis E. Higgins
ATTORNEY 3,666,463

MASK OVERLAY COMPARISON

David S. Beynnon, Burlington, and Bruce D. King, South Burlington, Vt., assignors to International Business Machines Corporation, Armonk, N.Y.

Filed July 6, 1970, Ser. No. 52,227
Int. Cl. G03c *5/04, 5/06*
U.S. Cl. 96—41 12 Claims

ABSTRACT OF THE DISCLOSURE

Patterns in a plurality of masks each having opaque and transparent regions are compared without altering the pattern of opaque and transparent regions in the masks. A photosensitive medium capable of indicating a different exposure condition for each mask is used for this purpose. The masks are superimposed sequentially over the photosensitive medium, and a different exposure condition is used to expose the photosensitive medium through each mask. A different amount of energy of exposure may be used for each mask or a different color of light may be used with each mask if a color sensitive photosensitive medium is employed.

BACKGROUND OF THE INVENTION

(1) Field of the invention

This invention relates to a process for comparing the registration of opaque and transparent regions in a plurality of masks used for the selective transmission of energy beams, such as light. More particularly, it relates to a process for comparing such mask patterns in which a photosensitive medium is exposed using the masks, without requiring alteration of the pattern of opaque and transparent regions in the masks.

A copending, commonly assigned application Ser. No. 47,497 filed by William O. Druschel, entitled "A Method for Comparing Masks" on June 18, 1970, describes an embodiment of a mask comparison process in which the opaque and transparent patterns in at least one of the masks is partially bleached in order to produce a grey image from that mask in a photosensitive material. Such a process is quite useful for comparing patterns in two masks. However, it is difficult to carry out where patterns in more than two masks are to me compared simultaneously.

(2) Description of the prior art

The above-mentioned co-pending Druschel application discusses fully the prior art techniques of mask overlay comparison. There remains today a need for further improvement in mask overlay techniques, especially in light of current developments in automated art work generation and continued increases in integrated circuit mask pattern densities. For example, an integrated circuit momory now in commercial production contains 664 circuit components in a silicon chip measuring only about 0.1" by 0.1", as reported in B. Agusta, "64 Bit Planar Double Diffused Monolithic Memory Chip," 1969 International Solid State Circuits Conference Digest of Technical Papers, vol. XII, p. 38.

SUMMARY OF THE INVENTION

Accordingly, it an object of this invention to provide a mask overlay process in which a photosensitive material is exposed through the masks wherein it is not necessary to alter any of the mask images prior to exposing the photosensitive material.

It is a further object of the invention to provide a mask overlay process in which a different exposure condition through an unaltered mask may be shown in the photosensitive material for each mask.

It is another object of the invention to provide a mask overlay process in which a photosensitive material is exposed through the masks which will allow rapid identification of which patterns correspond to which mask without requiring a study of the masks themselves.

It is still another object of the invention to provide a mask overlay process in which a photosensitive material is exposed through the masks wherein more than two masks may be readily compared.

These and related objects may be attained by employing the mask overlay comparison process herein disclosed. The present process compares patterns is a plurality of masks each having opaque and transparent regions through use of a photosensitive medium which is capable of recording a different exposure condition for each mask. Each mask is superimposed sequentially over the photosensitive medium, without altering the pattern of opaque and transparent regions in the mask. A beam of energy, for example, radiant energy, such as light, is then directed through the transparent regions of each mask while superimposed over the photosensitive medium. A different exposure condition, capable of being recorded by the photosensitive medium, is employed for each mask. With a conventional silver halide emulsion, such as Eastman Kodak High Resolution Emulsion, the different exposure condition for each mask is desirably the amount of energy of exposure for the emulsion from the light. A different energy sufficient to expose only partially the photosensitive medium is preferably employed with each mask. The result is a different shade of grey for the transparent patterns of each mask, and if the total exposure energy equals a sufficient amount to expose the emulsion fully, black pattern areas where transparent areas coincide in each mask.

If a typical multilayer color sensitive photosensitive medium is employed, a different color of light may be employed as the different exposure condition for each mask. The patterns in the photosensitive medium from each mask are therefore in a difference color.

Because this process does not require alteration of the opaque and transparent regions in each mask, the process may be easily carried out with more than two masks being compared, and while maintaining distinct identification of the patterns exposed in the photosensitive medium corresponding to each mask.

The foregoing and other objects, features and advantages of the invention will be apparent from the following more particular description and preferred embodiment of the invention as illustrated in the accompanying drawing.

BRIEF DESCRIPTION OF THE DRAWING

The drawing, composed of FIGS. 1 through 1A5 and 1B2, is a flow diagram primarily in cross section, showing the steps of a preferred embodiment of the present invention.

DESCRIPTION OF THE PREFERRED EMBODIMENTS

With reference to FIGS. 1, 1A and 1B, in the formation of a diode by means of sequential diffusions of base and emitter and collector-base shorting regions, these regions are respectively defined by openings in silicon dioxide layers formed by conventional photoresist and etching techniques. The photoresists, used to protect selective regions of the silicon dioxide during the formation of openings in portions of the silicon dioxide by etching, are respectively formed over regions to be protected by exposure through masks. FIG. 1 shows a plan view of a portion of such a diode. Base region 10 of a first conductivity type is formed during a first diffusion step into silicon substrate 11. The base region is usually P-type and is formed by the addition of a donor impurity, such as phosphorus, in the region 10. Three emitters 12 have an opposite conductivity type and are formed by a subsequent diffusion step, simultaneously with the formation of collector-base shorting region 13. The emitters 12 and shorting region 13 are usually N-type silicon and are formed by the addition of an acceptor impurity, such as boron. The collector region (not shown) of the device is formed in a buried layer in an earlier processing step. The emitters 12 must be positioned within base region 10, and shorting region 13 must be positioned a precisely predetermined location with respect to base region 10. It should be recognized that an actual integrated circuit may contain a number of diodes of the type shown in FIG. 1.

FIGS. 1A and 1B show, in plan view, a portion of a master mask used to form the base region 10 and the emitter regions 12 and shorting region 13, respectively. The complete mask for an integrated circuit would contain as many of the patterns shown in FIGS. 1A and 1B on glass substrates 11 as there are diodes of the type in FIG. 1 in the circuit, as well as patterns for other circuit elements that can be processed simultaneously with those shown. It is required to register emitter patterns 14 of master mask 17 on glass substrate 19 precisely within base pattern 16 of master mask 15 on glass substrate 21 and shorting pattern 18 precisely proximate to base pattern 16. Therefore, it is important to compare the base pattern 16 in master mask 15 with the emitter and shorting patterns 14 and 18 in the master mask 17 in order to determine that the two masks may be used for sequential process steps and allow base region 10, emitter regions 12 and shorting region 13 of the diode in FIG. 1 to be in proper registration, for each such diode in the integrated circuit being fabricated. Such a comparison is carried out as shown in FIGS. 1A1 through 1A5 and FIGS. 1B1 through 1B2 by forming contact print masks 20 and 22 from the master masks 15 and 17 respectively, then using the contact prints 20 and 22 for the sequential partial exposure of an emulsion layer 24 on glass substrate 26 to produce a composite overlay shown in FIG. 1A5 and consisting of light grey region 28, dark grey region 30, fully exposed black regions 32 and unexposed white region 34.

The first step in the overlay comparison process is to prepare contact print masks 20 and 22 from master masks 15 and 17, as shown in FIGS. 1A1–1A2 and 1B1–1B2, respectively. The contact print mask 20 is made from master mask 15 by fully exposing silver halide emulsion layer 36 on glass substrate 37 through mask 15 with light 39 to produce exposed regions 38 and unexposed region 40. The contact print mask 20 is therefore a reverse image of master mask 15. The contact print mask 20 is prepared for overlay in order to prevent damage to the master mask 15, which is used to make such contact prints for use in fabricating integrated circuits. The master mask 15 is itself never used for the manufacture of integrated circuits. Conventional development of the contact print mask 20 gives opaque regions 42 and clear region 44, as shown in FIG. 1A2.

A comparable process produces contact print mask 22 from master mask 17, shown in FIGS. 1B1 and 1B2. Light 39 is directed through the mask 17 to expose fully emulsion 46 on glass substrate 48 in regions 50, leaving regions 52 unexposed. Development of the exposed silver halide emulsion 46 produces opaque regions 54 and clear regions 56 in contact print 22.

The contact print mask 20 and 22 are now ready for use in making the mask overlay comparison. Contact print mask 22 is first used to partially expose silver halide emulsion 24 on substrate 26, as shown in FIG. 1A3. Light 58 is directed through contact print mask 22 for a sufficient time to provide two thirds of the energy necessary to expose fully emulsion 24. The result is dark grey region 30 in emulsion 24.

Contact print 20 is then used for a further partial exposure of the same emulsion layer 24 on substrate 26, as shown in FIG. 1A4. In this case, light 60 is directed through transparent region 44 of contact print 20 for a sufficient time to provide one-third of the energy required to expose fully emulsion 24, thus producing light grey region 28 in emulsion 24, and fully exposed areas 32 in emulsion 24. There remains unexposed region 34 in emulsion 24.

The completed overlay pattern is shown most clearly as a four tone image in FIG. 1A5. This four tone image of the diode in FIG. 1 shows not only the registration of the two mask contact prints 20 and 22, but also which portions of the diode come from which masks. The light grey region 28 is from mask contact plate 20, the dark grey region 30 is from mask contact plate 22, the white region 34 is exposed through neither mask, and the black regions 32 are exposed through both masks.

If more than two masks are to be compared, different exposure energies could be used for them, producing different shades of grey to correspond to each mask. In such a situation, an emulsion with wide exposure latitude, to produce the different shades of grey, is preferred. However, an even more convenient alternative embodiment of the invention would be to substitute a color sensitive photosensitive medium, such as a multilayer emulsion for the silver halide emulsion 24 in FIGS 1A3 and 1A4. Rather than employing different exposure times in this instance, a different color of light is directed through each mask contact print 20 and 22. By using a color sensitive medium and a different color light for each mask, as many as four or more masks could be compared in a single mask overlay comparison.

It should now be apparent that a mask overlay process which will attain the stated objects of the invention has been provided. The process does not require alteration of the opaque and transparent regions in the masks to be compared, and it enables a positive identification of the patterns in the overlay corresponding to each mask compared, without an examination of the masks themselves. While the process has been shown with masks used in the fabrication of integrated circuits, it is apparent that the process is equally applicable for other types of light masks as well.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A process for comparing patterns in two masks, each having opaque and transparent regions, comprising:

(A) directing a beam of energy through the transparent regions of a first one of said masks without altering its pattern of opaque and transparent regions on regions of a photosensitive material, capable of forming different image shades for different exposure times, corresponding to the transparent regions of said mask in an amount sufficient to expose only partially the regions of said photosensitive material, and (B) replacing said first one of said masks with the second mask, also without altering its pattern of opaque and transparent regions, in a position in registration with respect to said photosensitive material corresponding to that of said first one of said masks, and (C) directing a beam of energy in a different amount than employed for said first mask through the transparent regions of said second mask on regions of said photosensitive material corresponding to the transparent regions of said second mask, whereby an at least three-tone composite image of the two masks in registration is obtained.

2. The process of claim 1 in which the beam of energy is directed through the second mask in an amount also sufficient to expose only partially the regions of the photosensitive material, whereby a four-tone composite image of the two masks in registration is obtained.

3. The process of claim 1 in which the beam of energy is light.

4. A process for comparing patterns in a plurality of masks each having opaque and transparent regions, comprising:

(A) providing a photosensitive medium capable of indicating a different exposure condition for each mask, (B) superimposing sequentially each of said masks, with its pattern of opaque and transparent regions unaltered, over said photosensitive medium, and (C) directing a beam of energy through the transparent regions of each mask while superimposed over said photosensitive medium employing a different exposure condition, capable of being indicated by the photosensitive medium, for each mask.

5. The process of claim 4 in which the different exposure condition for each mask is the amount of energy provided to said photosensitive medium by said beam of energy.

6. The process of claim 5 in which the amount of energy provided to the photosensitive medium is varied by varying the exposure time.

7. The process of claim 4 in which said beam of energy is light.

8. The process of claim 4 in which the exposure of said photosensitive material through the transparent regions of said masks is, in each case, in a different amount sufficient to expose only partially said photosensitive medium.

9. The process of claim 4 in which the photosensitive material is wavelength sensitive and the different exposure condition for each mask is a different wavelength of said beam of energy.

10. The process of claim 9 in which said beam of energy is light, the photosensitive material is color sensitive, and a different color of light is directed through each mask.

11. A process for comparing patterns in a plurality of masks each having opaque and transparent regions, comprising:

(A) providing a wavelength sensitive photosensitive medium, (B) superimposing sequentially each of said masks over said photosenstive medium, and (C) directing a beam of energy of a different wavelength through the transparent regions of each mask while superimposed over said photosensitive medium.

12. The process of claim 11 in which the photosensitive medium is color sensitive, said beam of energy is light, and a different color of light is directed through each mask.

References Cited

UNITED STATES PATENTS

| | | | |
|---|---|---|---|
| 3,506,442 | 4/1970 | Kerwin | 96—44 |
| 3,403,024 | 9/1968 | Luce | 96—36 |
| 3,264,105 | 8/1966 | Houtz, Jr. | 96—36.2 |
| 3,411,905 | 11/1968 | Mooney et al. | 96—44 |

OTHER REFERENCES

Previously Filed Application, By Druschel, W. A., Serial No. 47,497, Filed June 18, 1970.

NORMAN G. TORCHIN, Primary Examiner

E. C. KIMLIN, Assistant Examiner

U.S. Cl. X.R.

96—44